United States Patent [19]

Weber

[11] 4,284,490

[45] Aug. 18, 1981

[54] R.F. SPUTTERING APPARATUS INCLUDING MULTI-NETWORK POWER SUPPLY

[75] Inventor: Harold J. Weber, Sherborn, Mass.

[73] Assignee: Coulter Systems Corporation, Bedord, Mass.

[21] Appl. No.: 66,917

[22] Filed: Aug. 21, 1979

Related U.S. Application Data

[63] Continuation-in-part of Ser. No. 945,805, Sep. 28, 1978.

[51] Int. Cl.³ .............................................. C23C 15/00
[52] U.S. Cl. .................................. 204/298; 204/192 R
[58] Field of Search ........................... 204/192 R, 298

[56] References Cited

U.S. PATENT DOCUMENTS

| 3,436,333 | 4/1969 | Beaudry | 204/312 |
|---|---|---|---|
| 3,632,494 | 1/1972 | Herte et al. | 204/192 |
| 3,803,019 | 4/1974 | Robison et al. | 204/298 |

OTHER PUBLICATIONS

G. N. Jackson, Electrical Characterizations of Double Electrode RF Sputtering Systems, Parts I and II, Vacuum, vol. 21, No. 11, pp. 533-543.

J. S. Logan et al., Electrical Characterization of RF Sputtering Gas Dicharge, Journal of Vac. Sci. and Tech., vol. 6, No. 1, pp. 120-123.

Primary Examiner—Delbert E. Gantz
Assistant Examiner—William Leader
Attorney, Agent, or Firm—Silverman, Cass & Singer

[57] ABSTRACT

Apparatus for radio frequency sputtering in the megahertz range, primarily higher than about six megahertz, in which the target and anode electrodes are at a low input impedance reactively such that the transfer of power to the target for practical sputtering is normally difficult. The useful plasma which provides the sputtering action has an effective high impedance which obtains between the electrodes during the sputtering process, this high impedance being shunted by a capacitive reactance made up of parasitic paths and similar capacitive components.

A string of at least three resonant networks is arranged between the high frequency r.f. source and the sputtering electrodes and these networks transform impedance and voltage from one end of the string at the source to different values and conditions at the other end of the string where they are tied to the electrodes in order to achieve a maximum of overall power transfer efficiency.

The invention provides for tuning of the networks, matching of the impedances and variations of circuitry to achieve the desired ends for different types of sputtering target configurations.

50 Claims, 7 Drawing Figures

R.F. SPUTTERING APPARATUS INCLUDING MULTI-NETWORK POWER SUPPLY

CROSS-REFERENCE TO RELATED APPLICATION

This is a continuation-in-part of a copending application Ser. No. 945,805, filed Sept. 28, 1978, entitled "POWER TRANSFER NETWORK" and assigned to the assignee of this application.

BACKGROUND OF THE INVENTION

This invention is concerned generally with the art of sputtering materials upon substrates and more particularly is concerned with apparatus that is required to sputter at r.f. in the megahertz range. The invention is directed to such apparatus in which it is necessary to transfer large amounts of power from an r.f. source to the sputtering plasma which is formed between anode and cathode electrodes that are mounted in a sputtering chamber and surrounded by background gas.

The reason for the requirement of transferring large amounts of power is that the particular apparatus of the invention is intended to sputter large areas of substrate from target surface that has an area also much greater than conventional. Since the useful power of the sputtering apparatus is invested in the plasma, the larger the plasma area, the larger the target area and the greater the power demands upon the source.

The invention is also concerned primarily with the sputtering of insulating materials in direct sputtering techniques, that is, where the sputtering is effected at r.f. utilizing target means that are formed of the complete compound that is to be sputtered. In such sputtering, the difference in vapor pressure between the different elements making up the compound and the maintenance of stoichiometry in the deposit upon the substrate is insured by the proper type of background gas or gases.

In recent years the art of sputtering nonconductive materials has expanded to a point where the demands which are placed upon the circuitry supplying power to the apparatus have become very great and in addition quite unusual. Conventional methods and circuits which have been disclosed in the prior art are no longer practical and hence cannot enable commercial production of sputtered materials with high yield. In order to sputter large areas of substrate at relatively high speed, one must use large targets and anodes for carrying the substrate so that the plasma is also quite large. Radical changes occur in such apparatus compared to the small throughput laboratory devices where batch sputtering was being carried out upon pieces of substrate that were substantially less than 50 square centimeters in area. Most importantly, for large plasma areas, the electrical phenomena which occur within the pressure chamber are totally different from those which occur in the small chambers and under the conditions known.

The principal problem which arises is brought about because the available power is undesirably lost to the capacitance shunting the plasma rather than absorbed by the plasma in a configuration of the type which includes large electrodes. This will be detailed hereinafter. It is only the power in the plasma which is useful.

Consider the requirements for sputtering a photoconductive material such as cadmium sulfide in a uniform coating upon a continuous strip of substrate such as polyester film or sheet metal that is more than a meter wide. A single target of the material to be sputtered, even for smaller width substrates than one meter, will certainly have an area exposed for generating plasma which is greater than 50 square centimeters and will usually have an exposed area at least several times greater than 50 square centimeters. Furthermore, to increase sputtering speed, such apparatus may have from two to as many as twelve or more large targets whose combined area can be several square meters. The problem which arises because of target size is exacerbated in a device of this size.

It should be kept in mind that the normal configuration for sputtering comprises a cathode and an anode in an atmosphere of gas having heavy ions, as for example, argon, with an electrical field established between them that is at r.f. for the sputtering of insulator materials such as the above-mentioned photoconductor cadmium sulfide. The cathode is the so-called target and is made out of the material to be sputtered, while the anode is the electrode toward which the molecules of the target material are driven for deposit. The substrate overlies the anode and the sputtering plasma which arises when the conditions are correct will appear between the target and the anode; hence the sputtered material will deposit upon the substrate instead of the anode.

For the purpose of aiding in an understanding of the invention herein, attention is invited to several patents which displace the general requirements and the construction of sputtering apparatus which is intended to be utilized for the sputtering of substrate on a production basis. The basic method of laying down a sputtered coating of a photoconductive material of the type for which the invention herein is generally intended is described in U.S. Pat. No. 4,025,339. This patent also discloses in a simplified manner the electrical circuitry of the sputtering configuration and gives an indication of the conditions of sputtering.

It is advantageous to dwell for a moment on the configuration of the electrodes in an arrangement as described in U.S. Pat. No. 4,025,339.

The sputtering occurs by virtue of the creation of an electrical glow discharge plasma between a target and an anode. The target is the cathode and it is coupled to an r.f. source of electrical power which is at an instantaneous negative voltage of several thousand volts. The anode is coupled to the r.f. source as shown in said U.S. Pat. No. 4,025,339 but is at ground potential or close to it. As taught in the said U.S. Pat. No. 4,025,339, the anode may be connected to a potential point that is slightly below ground potential, thereby giving rise to a so-called bias on the anode. While the power is applied in the form of r.f., there is a diode action occurring in the pressure chamber between the electrodes so that it is feasible to discuss the matter as though the arrangement were d.c. in action.

The bias of the anode is a desirable feature of an apparatus and method which enable the sputtered coating of photoconductor to have certain important characteristics as taught in said U.S. Pat. No. 4,025,339 and it must be pointed out that this bias can be achieved in different manners. In some cases it can be effected by direct conductor connections, as illustrated in said U.S. Pat. No. 4,025,339 and in other cases it can be achieved by means of geometry built into the sputtering apparatus and without any physically visible connections. In any event, the invention herein does not revolve around the establishment of a bias on the anode, and even if not present (although preferred), the problems which arise because of the use of large targets are solved irrespective of the presence or absence of bias on the anode. Specifically, if the anode is totally grounded, there will still be difficulty in achieving the sputtering plasma with large targets and the invention is still capable of obviating this difficulty.

In sputtering as contemplated by the invention, the chamber in which the sputtering occurs is formed of metal completely or to a large extent, and for practical and safety purposes, its walls are at ground potential. The target or targets (and there are normally a plurality of these) are mounted to the inner walls of the chamber by suitable insulating means and fittings which are required to provide the necessary mechanical support and at the same time permit of the coupling of r.f. power to the targets. They must also be removable because they are consumed slowly, and often pit and crack and must be replaced.

The anode or anodes are also mounted on the interior of the chamber and, as stated, are at ground or near ground potential. Several forms of sputtering apparatus are disclosed in U.S. Pat. Nos. 3,884,787; 3,829,373; and 4,014,779. From these patents it can be seen that the anode for the production manufacture of sputtered substrate is quite often in the form of a large rotary drum over which the substrate travels as the drum revolves, from a supply to a takeup reel both of which are on the interior of the pressure chamber. Large sputtering machines are not limited in construction to the presence of the supply and takeup on the interior of the chamber but can have air or pressure locks in their walls to enable continuous sputtering upon a pass-through substrate without opening the chamber.

In any sputtering apparatus of the type which is involved in this invention, the chamber is pumped down, the background gases are admitted and the glow discharge plasma is formed between the anode and the target or targets upon application of r.f. power to these electrodes. Discussions of the nature of the gases, their pressures and the techniques are found in the patents which have been mentioned and also in U.S. Pat. No. 3,976,555 which discloses a novel form of target with a special mounting to provide for efficient admission of the background gas and for cooling of the target, which is often required.

When the plasma is established it produces the desired effect by the actual bombardment of the target by heavy ions of the inert or nonreactive gas. These ions literally "splash" molecules of the target material out of the target, the molecules fly across the gap (which is of the order of centimeters) between the target and the anode, and impact against the substrate carried on the anode. The glow discharge plasma comprises the ionized atmosphere of the gas which is usually argon. In normal glow discharge, as in the case of any discharge of ionized gas, there is a dark space immediately at the surface of the target which is probably a form of space charge, this dark space being known as the Crookes dark space. No deposit of material will occur where this dark space is extant. Principally, the molecules will be deposited directly opposite the target so that the facing areas of target and anode control the deposit area, but the plasma does not necessarily confine the path of molecule movement nor is the plasma accurately confined by the subtended facing areas of target and anode.

Because of this fringe movement of high energy target material particles, it is necessary to provide shielding around the target to keep the particles from moving around to its sides and back and to confine the plasma path. This also keeps target material from being deposited on the walls of the chamber, although it is impossible to prevent some such deposit. The shielding is metal and is grounded and spaced from the target by a distance that is approximately the same as the thickness of the Crookes dark space so that in effect the dark space will occur before plasma is produced adjacent the target. This dimension may be several millimeters.

Additionally, as disclosed in the patents which have been mentioned above, the anode is shielded to prevent the deposit of the target material anywhere except upon the substrate that is being moved over the anode. In the case of large drums which are more than a meter long and perhaps almost a meter in diameter, it can be appreciated and understood that the shielding of the anode is quite substantial. This is important to the consideration of the bias of the anode which has been mentioned, but to a small degree upon the problem to which this invention addresses itself.

The frequencies at which sputtering machines may be operated at r.f. are established by the Federal Communications Commission of the United States at this time as the so-called Industrial, Scientific and Medical band (I.S.M.). The frequencies include 13.56 megahertz (mhz) and the second and third harmonics of that frequency. These frequencies are chosen such that operation will result in the least chance of interference with other r.f. services used in the United States. Foreign countries have quite similar arrangements such that the invention herein, as will be apparent, is applicable if used in foreign countries as well.

The apparatus of the invention is intended to be operated at the frequency of 13.56 mhz because there is little or no need for attempting to suppress the second and third harmonics which are those which would have the greatest radiating power. At this frequency, the quarter wavelength is about 5.5 meters, a length which is not impractical for the dimension of shielding members, walls and even certain kinds of electrodes in sputtering apparatus.

It is accepted in the art of sputtering with r.f. that best operation of the apparatus will be achieved if the frequency of operation is above about 6 mhz and the invention thus has particular application in the range of 6 mhz and higher; however, in any practical instance where the frequency of sputtering is effected in the megahertz range, the invention is of substantial value and can be applied. Any frequency below that range does not normally give rise to the problems solved by this invention. At low frequencies, conventional power supply and coupling circuitry can be used to pump power efficiently into a useful load.

It will be understood that the invention as described and claimed is concerned only with apparatus operated in the megahertz range.

Several of the different types of phenomena which give rise to the difficulty of pumping power into the useful load at megahertz frequencies are mentioned hereinafter. The useful load as explained comprises the sputtering plasma which occurs between the targets and the anodes or anode. Because of the fact that power is being robbed by parasitic paths and the like, only a small percentage of power produced at megahertz frequencies which is coupled to the sputtering apparatus by conventional power transfer and matching circuitry is used to produce the plasma.

The phenomena and factors which produce this difficulty are not independent of one another but interact in manners which are almost impossible to analyze on a rational basis. At best, measurements and testing could provide some rough guide as to what is occurring in an apparatus of a construction, but a variation in geometry and size would give rise to completely different factors.

The invention herein provides a structure which is generally suitable for the efficient transfer of power in practically any kind of sputtering apparatus which is designed to coat large areas of substrate from targets of large area.

To return to the discussion of the adverse factors which are involved in the inefficient transfer of power and which are rendered unimportant by the invention, the following are some of the things which give rise to the principal power transfer problems in large sputtering apparatus driven at megahertz frequencies:

A. Large targets and anodes

These would include not only those electrodes which have generally square configurations and configurations departing not too radically from square, but also would include electrodes which are long and thin. The large areas of over 50 square centimeters and more produce large parasitic paths by capacitive coupling to ground through the surrounding structure which includes the actual chamber walls themselves.

The long thin electrodes will additionally introduce distributed inductance along their lengths which becomes quite considerable at the frequencies of operation. If the actual length approaches a quarter wavelength at the frequency of the r.f., resonance and standing waves can complicate matters.

B. Surrounding structures

These would include the shielding around the targets which help in establishing the Crookes dark space around the target, the shielding if any around the anode, the walls of the sputtering chamber and any supporting metalwork in the chamber for other purposes. The presence of the surrounding structures produces capacitive coupling and since the surrounding structure is grounded, there are multiple capacitive bypass paths for the power to ground.

It might be pointed out that it has been noted in some large sputtering apparatus of the type to which the invention is applied that the capacitance of the target and anode electrodes produce approximately ten to twenty percent of the total capacitance estimated for the entire apparatus insofar as input to the load circuit is concerned. This means that the surrounding structure accounts for 80% to 90% of the total capacitance, and all of this is parasitic coupling that is not useful to establish the plasma load.

In one apparatus which has an anode drum with the dimensions of about one meter in diameter and about one meter in length, the coupling of the anode was so insignificant relative to the surrounding structure coupling that the drum could be removed from the apparatus without substantially detuning the feed circuitry of the invention. This was ascertained by using a dummy load of tungsten lamps in place of the plasma. This meant that practically all of the capacitive coupling in the load circuit was provided by other factors, but additionally indicated that the circuit of the invention was effectively achieving the ends sought. A conventional circuit would also look into the same load but would be unable to support the dummy plasma load or an actual plasma load.

C. Power transfer problem generally

If we consider a power source that has an impedance of about 50 ohms and we require this power source to drive a load which looks like 1000 ohms shunted by an impedance to ground of the order of 23 ohms, in order to get the power into the load at a voltage of about 1000 to 2000 volts, the source will have to generate enormous power. To develop 1600 volts RMS across 50 ohms, we would need about 32 kilowatts.

The figures given above represent the actual conditions in a sputtering apparatus which is to be operated in the megahertz range. The r.f. power source has an internal impedance of about 50 ohms; the useful load is the sputtering plasma which has an almost resistive impedance of about 1000 ohms; the impedance effect of the shunting parasitic capacitance to ground is about 23 ohms. Of this 32 kilowatts, about 2000 watts will be used in the target and plasma and the rest of the power will be wasted, reflected back to the source.

What is required is to have an input impedance to the load circuit which matches that of the source. That requirement is impossible to meet with conventional coupling techniques. Thus, if a matching transformer is inserted between the source and the load circuit, the secondary of the transformer would have such a high impedance relative to the shunting capacitance that the greatest majority of power would be displaced in the secondary itself. What is not dissipated would be reflected back to the source of r.f. and the load would get little if any power.

D. Resonance in matching components

This problem is probably related to the previous subject matter because it is concerned with impedance matching. In an impedance matching circuit of the type which would be considered conventional to achieve the power transfer needed, it is required to self-resonate parallel circuits. In the megahertz frequency range, and especially at 13.56 mhz which is the preferred frequency, it is very difficult if not impossible to achieve self-resonance using practical components. The inductance required to resonate with the high capacitance of the parasitic paths would have to be of the order of a couple of hundred nanohenries, and an inductor having this minute inductance will be unable to handle the required power, let alone be capable of ready construction.

In order to follow the description of the invention, it is essential to understand and appreciate the concept of the factor Q or figure of merit or quality of a component or a circuit made up of electrical parts. It is also essential to understand the difference between the static factor Q and the dynamic or loaded factor Q which will be designated QL hereinafter.

Initially, it may be generally understood that the quality factor Q is a ratio of the energy storing ability of a component or circuit to its energy loss.

Unloaded or static Q should normally be as high as possible. In the case of inductors, this is achieved by using materials that produce as little resistance as possible, as for example by using high conductivity tubing. In the case of the coils of the inductors of the invention which will be described, some of them are wound from copper tubing which is upwards of 8 mm. in diameter and silver-plated. Capacitors should have the lowest loss possible, and in the case of the capacitors used in circuits according to the invention, these are vacuum dielectric type, the variable ones being varied by mechanical shafts passing through vacuum seals.

A typical coil for use with a tuned circuit of the invention having four turns of 13 mm. diameter copper tubing in a helix about 15 centimeters long and 15 centimeters in diameter is tapped at suitable locations inwardly from its ends and tuned to resonance by a vacuum capacitor rated at 20,000 volts and having a capacitance which can be varied from 12 to 100 picofarads. Such a coil would have a static Q of several hundred or more.

Loaded or dynamic Q is a totally different matter because of circulating current. In the case of resonant circuits such as those of the invention, QL is determined generally by the relationship between the circulating current in the circuit and the current to be supplied by the input source to the circuit. High QL means high circulating current or high impedance and this is not desirable for maximum power transfer. It then becomes a compromise between the dynamic QL and the static Q. The static Q should be as high as possible and the QL should be quite low.

In tank circuits of the type involved in the invention, it has been accepted in the art that efficient power transfer is achieved where the QL of the tank circuit is preferably below 15. The range which is usually satisfactory is between 3 and 12 although that upper limit is not preferred. This range provides good stability for tuning since the response is broader than with higher values of QL. Higher values of QL increase the impedance of the circuit and increase the circulating current. Incidentally, for transmission and reception of intelligence, the broadening effect of low QL is undesirable because it decreases the ability of a given circuit to reject unwanted signals.

In the case of intelligence transmission, power transfer by tuned circuits is desired as well as in the case of a sputtering apparatus, but the purposes are different. In the case of an antenna, it is desired to produce the greatest current possible in the load, that is, the antenna. In the case of a sputtering plasma, it is desired to produce the greatest voltage possible in the load.

The targets of the invention have capacitances of the order of 250 to 650 picofarads so that the effective dynamic resonant load impedance of a tuned circuit must include the very substantial parasitic capacitance and some external parallel inductance chosen to resonate at the exciting frequency. This impedance turns out to be of the order of a few hundred ohms. But it is essential to develop a moderately high voltage of the order of 2,000 to 4,000 volts peak to peak across the tuned circuit.

By simple calculations using typical values encountered in the apparatus which is the subject matter of this invention, it can be seen that there is a typical problem. Assuming the source to be a 50 ohm 13.56 megahertz r.f. source, if the typical target has a parasitic capacitance of about 350 picofarads (0.00035 microfarads) the operating values will assume proportions making the target circuit extremely difficult to drive from the source with any reasonable efficiency of power transfer. This is shown as follows:

Assume that the target capacitance which is all parasitic is 350 pf, then $$X_{CT} = \frac{1}{2\pi f CT} = 33.55 \text{ ohms} \quad (1)$$

where $X_{CT}$ is the capacitance reactance of the target,
f is the r.f. frequency and
CT is the target capacitance.

The value of QL can now be computed from a well-known formula and the value of the plasma resistance which, for a typical apparatus of the size involved will be approximately 1,000 ohms. This value is $$QL = \frac{RT}{X_{CT}} = 29.81 \quad (2)$$

where QL is the loaded figure of merit or quality which was discussed above and $X_{CT}$ is the same parameter used in equation (1). The target impedance ZT is the product of the quality factor QL and the target impedance $X_{CT}$.

As noted, the value of QL given in equation (2) is much too large for efficient power transfer, being almost twice the maximum mentioned.

A conventional solution to this dilemma is to connect the source through a center tapped coil at the target. The resulting effect on power transfer can be ascertained from the following:

$$X_{CT(\text{eff})} = X_{CT}\left(\frac{n1 + n2}{n1}\right)^2 = X_{CT}\left(\frac{nt}{n1}\right)^2 = \quad (3)$$
$$X_{CT} \times 4 = 134.20 \text{ ohms}$$

where n1 is the number of turns in the primary winding of the coil, input to ground;

n2 is the number of turns in the secondary winding of the coil, input to output;

nt is the total number of turns in the coil;

$X_{CT}$(eff) is the effective target capacitive reactance; and $X_{CT}$ is the same parameter as used in equations (1) and (2).

In equation (3) it is assumed that the center tap is at the exact center of the coil, which is typical.

Computing the target resistance for the center-tapped circuit, $$RT_A = RT\left(\frac{n1 + n2}{n1}\right) = RT\frac{nt}{n1} = 1,000 \times 2 = 2,000 \text{ ohms} \quad (4)$$

where $RT_A$ is the effective target resistance.

We can now compute QL for this center tapped circuit using the formula from equation (2) and equations (3) and (4).

$$QL_A = \frac{RT_A}{X_{CT(\text{eff})}} = 14.9 \quad (5)$$

and substituting in the formula given above for the target impedance we see.

$$ZT(\text{eff}) = QL_A \cdot X_{CT} = 500 \text{ ohms} \quad (6)$$

here ZT(eff) is the effective impedance of the target circuit using the center tapped coil.

If we assume that the input to the tapped center coil is the 50 ohm source described above, then we can determine the location of the tap of the resonant coil in order to achieve the correct impedance match on the basis of the following:

$$T_{1N} = n1 \frac{Z_{1N}}{ZT(eff)} \quad (7)$$

where $T_{1N}$ is the number of turns at the proper tap and
$Z_{1N}$ is the impedance at that tap.

For the assumed values this turns out to be the 31.6% point which gives a voltage step-up of 3.16 to 1. With a typical power capacity of the source being 1,800 watts, 300 volts RMS will be developed across the 50 ohms of the output of the source but only 948 volts RMS will appear across the target circuit, this being 2,675 volts peak to peak. This is an efficiency of about 74.3% and the voltage is insufficient to provide the necessary sputtering effect. This requires a peak to peak voltage at the target which is upwards of 3,600 volts peak to peak. In order to achieve this with the conventional tapped coil as described above, the power source would have to be increased to about 2,400 watts and of this energy, about 600 watts will be lost in useless heat and reflected back to the source during operation.

As will be detailed hereinafter, the invention achieves an efficiency of more than 90% because of the circuitry which will be described and claimed. The 1,800-watt power source mentioned will achieve more than 3,600 volts peak to peak at the target.

As will be further described, the invention is ideally suited for multiple target apparatus whereas the conventional circuit becomes worse. When the number of targets is increased and these are driven in parallel, the impedance decreases by a factor which is equal to the number of targets, the actual effect being an increase in capacitance. If we assume that the best coupling efficiency for a conventional tapped circuit which is described above is about 74%, by the time the number of targets has increased to twelve (which is typical of the apparatus of the invention) the efficiency will have dropped to about 22%. In such a case, for an actual 1,800 watts of power per target, the conventional system would require a source of 100,700 watts with a resultant loss of about 80,000 watts.

On the other hand, the efficiency of the invention is not materially affected. By slight adjustment, the circuit of the invention continues to drive the twelve targets from a source of suitable wattage, say about 22 KW with an efficiency of well over 90% and very little losses.

SUMMARY OF THE INVENTION

Apparatus for supplying power efficiently to the discharge plasma load in a sputtering chamber by means of r.f. in which the r.f. source is at low voltage and low impedance and the plasma load is represented by a relatively high impedance shunted by capacitive reactance of a very low value.

The shunting capacitive reactance is primarily due to the existence of parasitic capacitive effects, the targets of the apparatus being relative large and there being surrounding structure which provides many stray capacitive paths.

The apparatus includes structure for transporting a web of substrate through the gap between the cathode and anode of the sputtering apparatus while the plasm glow discharge is established therebetween so that the material of the target will be sputtered on the substrate.

The source is coupled through a string of networks which are connected in tandem, there being at least three such networks for any given target configuration. The first network following the source is an impedance transfer network in which the source voltage is raised along with the impedance. The second network is an idler network in which the voltage at the output of the first network is raised quite substantially and the proper voltage for driving the target is chosen by suitable tapping from a coil across which the high voltage appears in the idler circuit. The third network is a resonant load network which includes the capacitance of the target, the network coupling the output voltage from the idler network to the target and including inductive reactance means to compensate for the capacitive reactance means of the target so that the proper voltage can appear across the target and be used efficiently to create the plasma without being bypassed to ground through said capacitance.

DESCRIPTION OF THE PREFERRED EMBODIMENTS

Before commencing the detailed description of the invention, it is believed essential to point out the importance of the environment in which the invention finds application. The field has been described as the sputtering of primarily insulating materials and specifically photoconductor material which is wholly inorganic upon substrates. The substrates are flexible and during the sputtering process they move through the apparatus rather than remain fixed. It is desired and intended that the resulting product be one that is manufactured on a continuing production-line basis.

The apparatus for sputtering is thus quite large compared to anything that has been previously known and the mechanical and electrical parts thereof are also quite large. The substrate passes over an anode or anodes at relatively high speed considering that the coating of the sputtered material is being laid down in the form of molecules and compared to the sputtering processes heretofore known. The problems which have been described arise because of the size considerations and thus the solution to them which embodies electrical circuitry must take into account the electrical effect upon the transfer of power of the components of the apparatus.

Accordingly, the invention describes and claims apparatus which has electrical components that are coupled to the sputtering machine per se but which must include as part of the combination those elements that are in the sputtering chamber and are part of the chamber which produce the problems that are solved. Specifically, the invention resides in the external circuitry plus the electrodes and the surrounding structure of the sputtering chamber.

The essence of the invention is appreciated by considering that a relative low power r.f. source is being used to drive a low impedance load at a substantially higher voltage with maximum efficiency. Typically, an 1800-watt r.f. power supply which has an output of 850 volts peak to peak and an internal impedance of about 50 ohms eventually drives a load which has a dominant capacitive impedance of about 50 ohms and requires a voltage of 3600 volts peak to peak. This is accomplished by a series of networks that effect impedance and voltage transformation as a result of proper choice of QL of the circuits. The effect of the dominant impedance is eliminated so that the plasma impedance which is about 1000 ohms absorbs all of the power at the high voltage.

Figure 1:
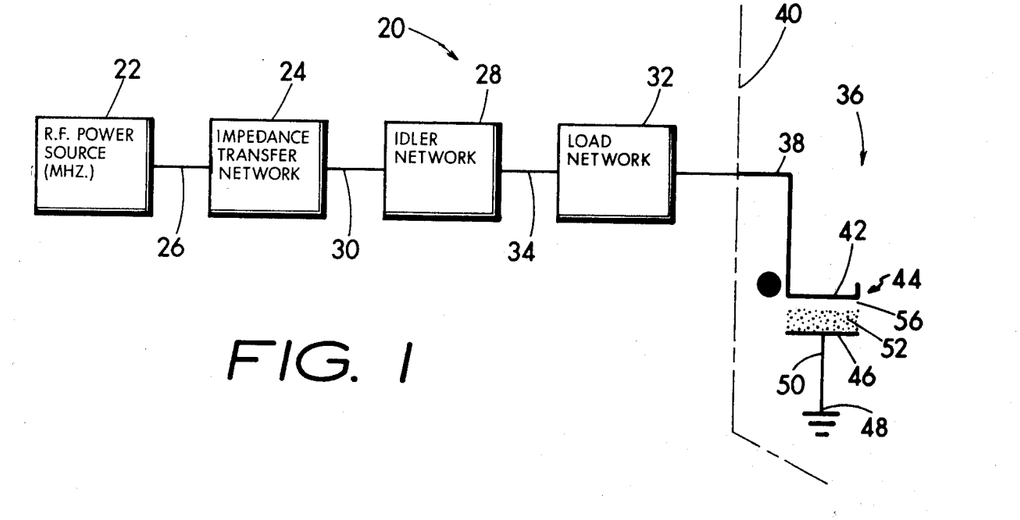
FIG. 1 is a simplified block diagram with a symbolic representation of sputtering apparatus illustrating the basic form of the circuitry of the invention, the sputtering apparatus in this case including a single target or cathode and an anode providing a single plasma field.

Referring now to FIG. 1 of the drawings, there is illustrated a block and symbol diagram which embodies the invention, this comprising the apparatus designated 20. The combination includes, as indicated, so much of the sputtering apparatus per se as contributes to the electrical effects which produce the problems solved by the invention and which participate with the external circuitry in the solution of these problems.

The external circuitry is shown to comprise four components which consist of a source of r.f. power 22, an impedance transfer network 24 coupled to the source of r.f. power 22 through the transmission or coupling means 26, an idler network 28 coupled to the impedance transfer network 24 through the coupling 30, a load network 32 coupled to the idler network 28 through the coupling 34 and a sputtering apparatus or chamber 36 which is coupled or connected to the load network 32 by way of a line 38 that passes through the container wall 40 of the chamber 36 and extends to the cathode or target 42 of the electrode configuration 44 of the apparatus. The electrode configuration 44 includes an anode 46 which is shown grounded at 48 by way of the line 50. The stippled area 52 represents the glow discharge plasma or plasma field which is established between the electrodes during the operation of the apparatus 36, there being a small space shown at 56 to represent the Crookes dark space adjacent the face of the target 42. The large dot signifies that there is a gaseous atmosphere in the chamber 36 as disclosed in some of the patents mentioned above.

The load network 32 is not to be considered an independent component or circuit inasmuch as the resonant condition which will be described to exist therein must take into account the effects of the electrode configuration 44 on the capacitance of the network 32 and the effects of the surrounding structure which is not shown in FIG. 1. As a matter of fact, one of the features of the invention is that the inductance of the load network 32 bucks the capacitance of the electrode configuration 44. This will be explained hereinafter.

The output of the power source 22 at the coupling or transmission line 26 is a low value, normally of the order of 50 ohms. R.F. power is applied through this coupling 26 to the input of the impedance transfer network 24. The impedance transfer network 22 converts the power signal into a signal which produces a higher impedance at the output coupling 30. There is also a voltage transformation achieved.

In one example the impedance transfer network comprises a series of resonant Pi networks and in a second example it comprises a parallel resonant circuit which includes a coil and capacitor with the coil tapped at a suitable point to provide the desired voltage. The coil serves as an autotransformer to raise the voltage. In both cases, there is an impedance transformation so that the output coupling 30 is at a much higher impedance than the input coupling 26. This value typically is 1250 ohms, i.e., the square of the voltage transformation ratio.

In both cases, the voltage at the input of the impedance transfer network 24 is about 850 volts peak to peak while the output is 4250 volts peak to peak. This is brought about through proper choice of capacitor and coil and the taps chosen for the input and output from the network. The QL of the practical circuit in this case was 6.25. The static Q of the circuit was of the order of 200 or more; hence substantially greater than ten to one relative to the QL.

The idler network 28 in every case comprises a stepup transformer which is an autotransformer and whose purpose it is to raise the voltage of the output of the impedance transfer network 24 substantially. The circuit of the idler network 28 is also a parallel resonant circuit and the tap on the transformer is chosen to give a high voltage at the coupling 34. This is 3600 volts peak to peak at the output 34 with a lowered impedance, say of the order of 1000 ohms intended to drive the target 42 and its plasma.

The load network 32 is another resonant circuit including an autotransformer and is coupled to the cathode 42 through a coupling capacitor in the line 38. The parasitic capacitance of the apparatus 36 in the combination with the load network 32 operates to bring the impedance in the line 38 down to about 500 ohms with the voltage remaining at 3600 volts peak to peak. This network eliminates the effect of the low impedance bypass in the sputtering electrodes and thus permits the idler output to be efficient.

In the idler network there is a resonant condition which provides a multiplication of the voltage input at 30. This voltage input of 4,250 is increased by a factor which is the QL of the idler network 28. The practical example of the invention provided a QL for the idler network of about 4.2 such that the high voltage end of the transformer in that circuit generated a voltage which was 4.250×4.2 or about 18,000 volts peak to peak. With this as the high voltage at one end of the transformer it is a simple matter to tap the transformer at a suitable point to achieve the output voltage at 34 as 3,600 volts peak to peak, this also being the output voltage from the load network.

As a result, there is a completely efficient transfer of power since the output impedance at 38 matches the effective load impedance which is about 500 ohms and occurs at a voltage which gives the best plasma conditions, this being about 2,000 to 4,000 volts peak to peak.

Figure 2:
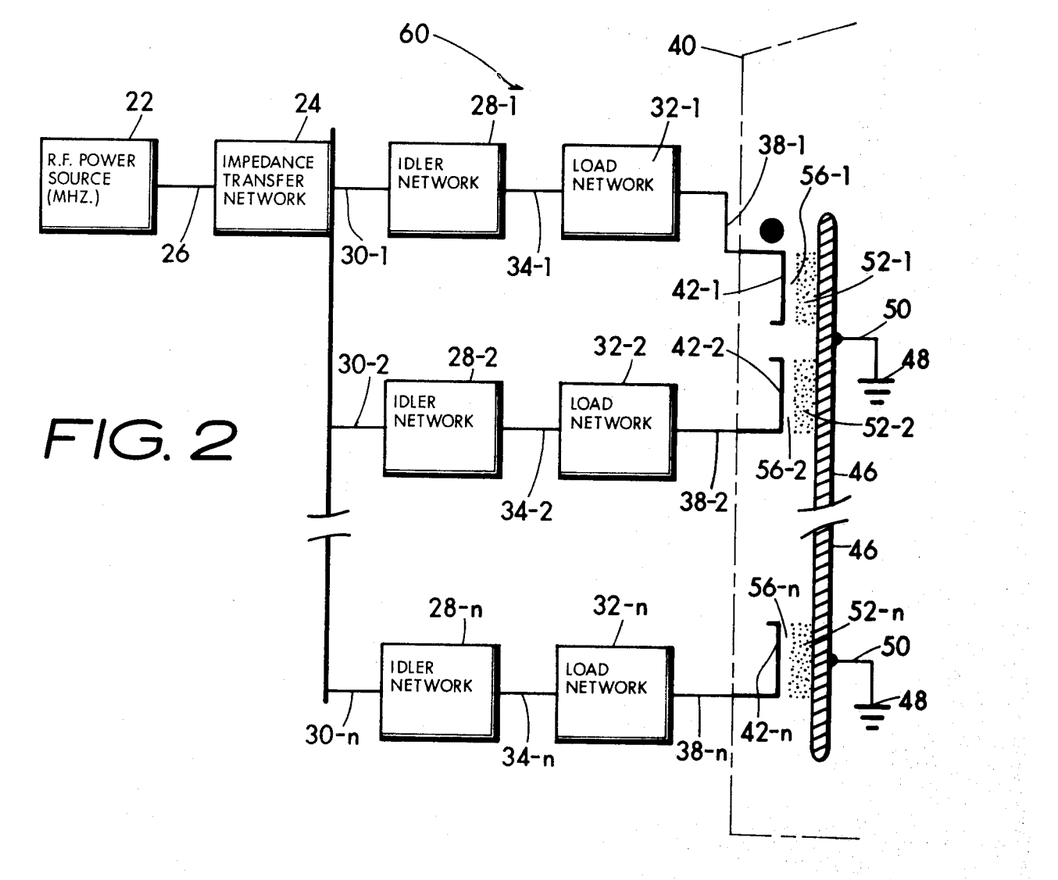
FIG. 2 is a view similar to that of FIG. 1 but in this case there is a plurality of plasma fields and the form of circuitry includes a plurality of idler and load network combinations, each combination feeding a single plasma field.

In FIG. 2, there is illustrated the block diagram of a modified form of the invention in which the same reference numerals are used (as in other figures in the specification) to designate the same or equivalent components. Here the apparatus 60 comprises a sputtering device 36 which has a single anode 46 but a plurality of cathodes or targets 42-1, 42-2 . . . 42-n, it being understood that any number of targets could be used within practical limits.

The same power source 22, coupling 26 and impedance transfer network 24 is utilized as in the case of the apparatus 20 of FIG. 1. There is a separate idler network and load network for each target in order to simplify tuning and to prevent interaction between targets and their respective related load circuits. As it is, there will always be some electrical interaction so that tuning must be effected in steps to arrive at the optimum conditions. The idler networks 28-1, 28-2 . . . 28-n are each constructed substantially the same as the network 28 of FIG. 1 and perform the same functions. Likewise the load networks 32-1, 32-2 . . . 32-n are of the same construction and function as the network 32 of FIG. 1. The couplings 30-1, 30-2 . . . 30-n are the same as the coupling 30 of FIG. 1; the couplings 34-1, 34-2 . . . 34-n are the same as the coupling 34 of FIG. 1; the lines 38-1, 38-2 . . . 38-n are the same as the line 38 of FIG. 1.

In this instance, each of the cathodes has its independent plasma 52-1, 52-2 . . . 52-n with the attendant Crookes dark spaces 56-1, 56-2 . . . 56-n as in FIG. 1. It may be assumed that there is a common substrate overlying or moving past the anode 46 which is grounded through the lines 50 to ground 48, or, independent substrates may overlie the anode in the vicinity of the respective plasma fields. Obviously, since the apparatus 36 is expected to have a large throughput, it is preferred and practical that a single length of substrate be continuously moved over the anode 46 and be subjected in sequence to the plasma fields.

Figure 3:
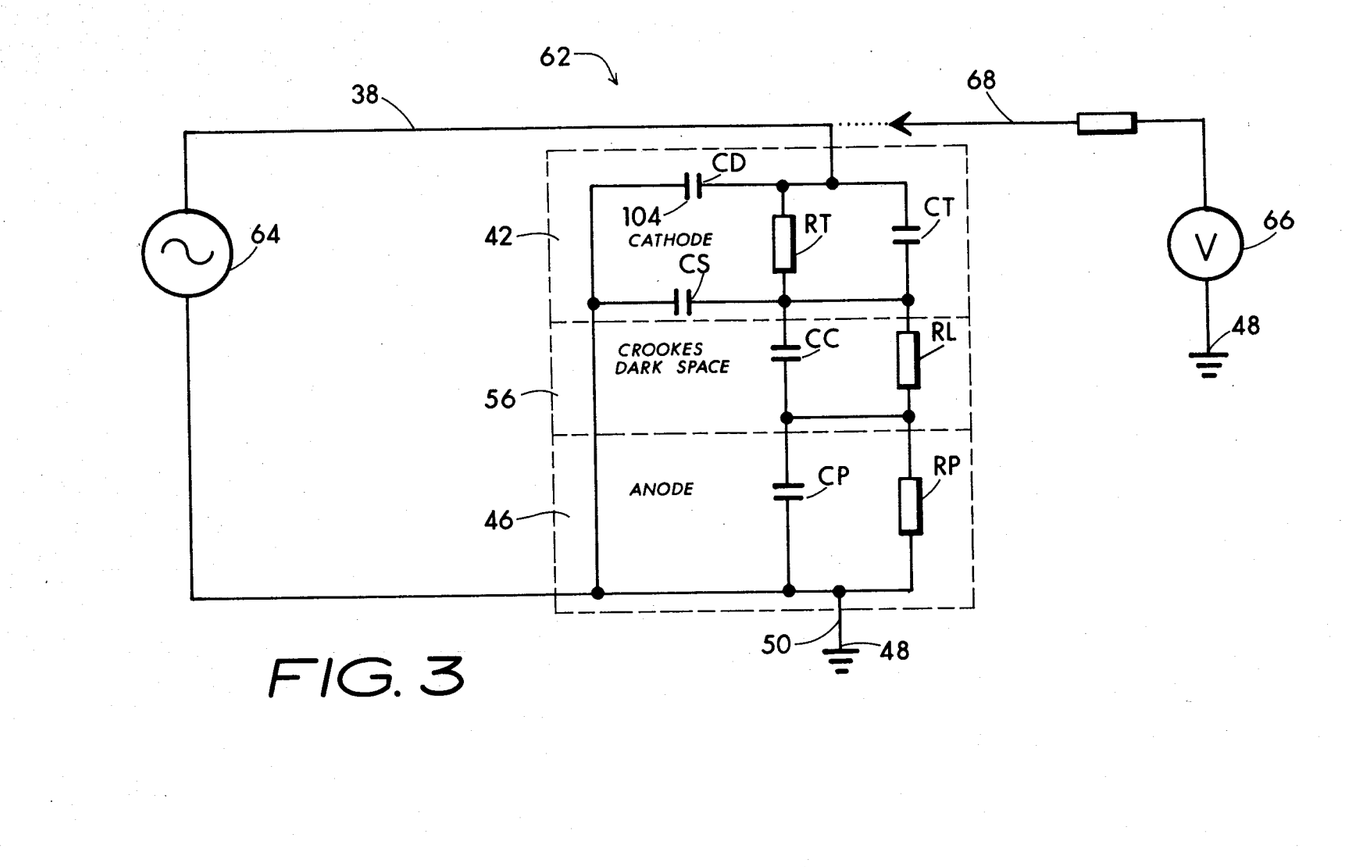
FIG. 3 is a theoretical electrical circuit diagram which attempts to illustrate the equivalent of the dynamic circuit for a high frequency excited plasma field produced by the apparatus of the invention.

In FIG. 3 there is illustrated a circuit diagram 62 which is a theoretical attempt to depict the equivalent circuit of a target configuration such as 44 in the dynamic mode, that is, while it is involved in sputtering a material and while there is a plasma field in existence between the electrodes.

There is shown a simple r.f. source 64 which is impressed across a circuit 66 which comprises the capacitances and resistances that are shown. These are as follows:

CD is the input distributed capacitance;
CS is the target shield distributed capacitance;
CP is the sputtering plasma capacitance;
CT is the target capacitance;
CC is the Crookes dark space capacitance;
RT is the resistive impedance of the target;
RL is the resistive loss; and
RP is the plasma resistance.

The complex circuit is divided into boxes by broken lines which generally represent the cathode or target 42, the anode 46 and the dark space 56, but in a dynamic sense, that is, when the apparatus 36 is operating and a plasma field exists between the electrodes.

In practical embodiments such as the type of sputtering apparatus for which the invention was evolved, the input capacitance CD is predominantly contributed by the target connecting means such as vacuum feed-through fittings, target mountings and the like.

With semiconductor or nonconductive material sputtering targets, the impedance RT is high and the capacitive reactance CT is very low, and hence dominant in contributing the overall impedance to the configuration because it shunts the impedance RT as indicated in FIG. 3. With metal or other conductive targets the impedance RT would be low, being practically zero, shunting and negating the reactive impedance effect of the target capacitance CT. In practical sputtering target configurations, shielding means of metal surround the target to inhibit glow discharge from all but the forward active surface of the target. Such shielding means will be spaced a few millimeters or so from the target to be within the confines of the Crookes dark space to prevent redeposit of the sputtered-off material upon the rear and sides of the target. The proximity of these shielding means introduces considerable parasitic capacitance which is indicated at CS.

The dark space which occurs in the gap between the target and the anode results in a dark space capacitance CC but, since it is not completely capacitive, it is shown shunted by a small resistive path RL called resistive loss.

The plasma or plasma field is in effect a glow discharge which occurs between the two electrodes and represents the ionization of the background gas. This may be considered a capacitance CP shunted by a moderate discharge resistance RP. This latter resistance RP is considered to be the dominant contributor to the load impedance of the power system which must be supplied by the source 64. The plasma appears as a resistance RL of the order of 1000 ohms and a parallel capacitance CC of the order of say 20 to 50 picofarads between the cathode 42 and the anode 46.

In FIG. 3 one can analyze the various theoretical components and appreciate what occurs in the sputtering apparatus under dynamic conditions. Through this diagram it is fairly clear why the problem which has been described above arises.

In FIG. 3 there is also illustrated a d.c. target voltage meter 66 which is connected by a suitable probe 68 through a high frequency decoupling network to the lead 38 which enables the measurement of the negative d.c. voltage across the target to ground 48. It will be appreciated that there is a d.c. component across the electrodes because of diode action which must occur in a configuration of this kind and with the plasma glow discharge.

Figure 4:
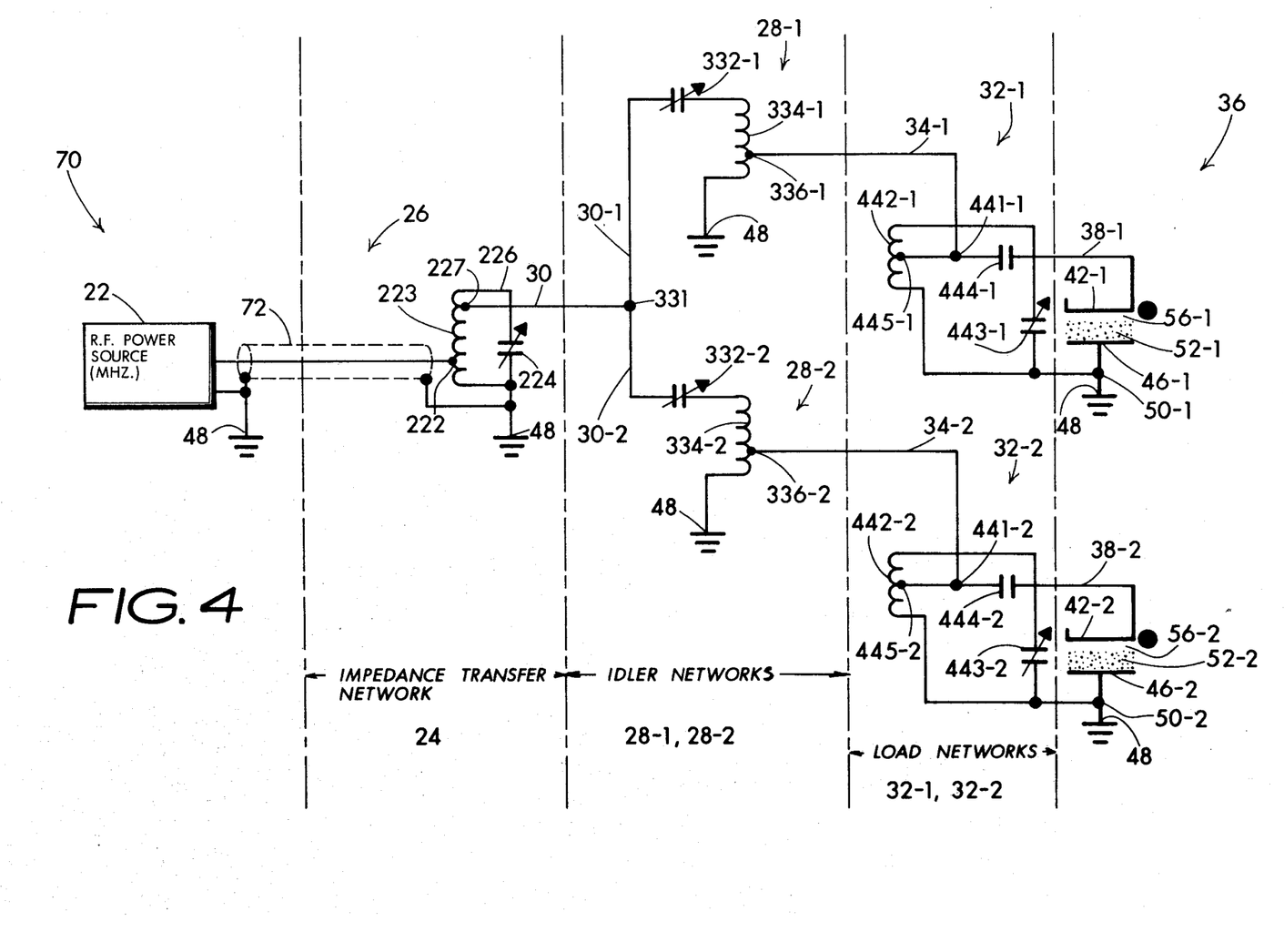
FIG. 4 is a more detailed diagram, principally in conventional circuit form, of an apparatus of the type which is illustrated in FIG. 2, for feeding a pair of plasma fields.

Inviting attention at this point to FIG. 4, it will be seen that this comprises a general circuit diagram with portions shown schematically and by symbol of a sputtering apparatus 70 illustrating an arrangement in which there is a sputtering chamber or machine 36 enclosed by a single container 40 in which there are two targets 42-1 and 42-2 as well as two anodes 46-1 and 46-2. The basic arrangement which includes the grounding of the anodes and the illustrated dynamic condition which gives rise to the plasma and dark spaces are derived from the view by observing that the reference numerals follow the same system as used in FIGS. 1 and 2.

In this case the r.f. power source 22 operating at megahertz frequency is coupled to the impedance transfer network 24 by means of a coupling designated generally 26 which in this case is shown as a coaxial cable 72 whose shielding is grounded at 48 and whose internal impedance is usually 50 ohms. Some cables of this type have somewhat higher impedance, say 73 ohms. The inductor 223 comprises an autotransformer which is made out of the large diameter tubing mentioned previously and it is connected across a variable capacitor 224, typically 80 picofarads by means of which it is tuned to resonate at the frequency of the source. At resonance, the coil 223 acts as a stepup impedance and voltage transformer. The upper terminal 226 of the inductor 223 is the high impedance signal point of the network 24 operating at a voltage that is substantially greater than that of the power source 22. The power source voltage is tapped into the transformer 223 at the tap 222 at an impedance point to match the impedance of the source. Typically the voltage is about 850 volts peak to peak at that tap point 227. The impedance at the tap point 227 has also been raised by the square of the turns ratio and this typically would be about 1,250 ohms.

The output coupling line 30 connects at 331 to two branches 30-1 and 30-2 which thus couple the impedance transfer network 24 to two idler networks 28-1 and 28-2, respectively. These networks are substantially identical and comprise resonant circuits formed of capacitor and inductor in each case. The upper circuit in FIG. 4 comprises the variable capacitor 332-1, typically 75 picofarads, and the inductor 334-1, the latter acting as an autotransformer and the components being of the general construction previously described. The inductor 334-1 is tapped at 336-1 and its bottom terminal is grounded at 48.

The lower idler network 28-2 is constructed similarly of the variable capacitor 332-2 and the inductor-transformer 334-2 tapped at 336-1. Both of the networks 28-1 and 28-2 are arranged to resonate at the frequency of the source and respectively couple to load networks 32-1 and 32-2 through the coupling lines 34-1 and 34-2. These networks 28-1 and 28-2 may be considered series resonant; hence it will be understood that the voltage at the upper terminal of each of the inductors 334-1 and 334-2 will be substantially higher than the voltage at the connection 331. These voltages for balanced circuits will be the same and will be related to the QL of each of the circuits. This was explained previously and it was pointed out that the upper terminals of the inductors 334-1 and 334-2 could be at voltages of 18,000 peak to peak for QL being about 4.2 with an input voltage of about 4,250 volt peak to peak at the connection 331. With the inductors tapped off at 336-1 and 336-2, respectively at 20%, the output voltage at the coupling lines 34-1 and 34-2 will be about 3,600 volts peak to peak and the impedance will be about 500 ohms.

These taps 336-1 and 336-2 are selected to provide the peak to peak voltages needed to establish the correct r.f. potential across the targets 42-1 and 42-2.

The positions of the taps 336-1 and 336-2 are critical and hence must be chosen carefully during the tuning procedure. A fraction of a turn one way or the other from the ideal location will change the efficiency of power transfer. Such taps are effected by means of clips which are manually clamped in place on the large diameter tubing that form the inductors.

The purpose of choosing the proper tap is to achieve the best combination of QL values for each network. It may be understood that all inductors will be made out of large diameter relatively thin wall copper tubing and will have Q as well over 175. There is so little loss in any part of the circuitry that there is no need to water cool any inductors.

The position of the taps 336-1 and 336-2 will control the voltage and the impedance on each line. For example, if instead of a 20% tapped position it was about one-third up from the grounded end, the voltage would be 6,000 volts peak to peak at these tapped points instead of the value previously mentioned, assuming that the total voltage across the inductors was 18,000 volts peak to peak. Likewise there would be a different impedance which depends upon the square of the turns ratio at the tapped points.

It has been mentioned that the load network 32 of FIG. 1 is not independent of the conditions in the sputtering chamber and this is also true of the actual circuitry of FIG. 4. The principal impedance of the load is a substantial total capacitance to ground shunted by a moderate resistance under dynamic conditions of sputtering with plasma present (FIG. 3). In the circuitry of the apparatus of the invention, the target capacitance of the target 42-1 and its parasitic paths is caused to resonate at the source frequency with the inductor 442-1. The capacitor 443-1 is a resonance balancing capacitor for tuning the load network 32-1 for the particular target. The construction of the large tubing inductors 442-1 and 442-2 makes it impractical to vary their inductance mechanically although this can be done if needed.

The same construction is used in the load network 32-2, the inductor 442-2 and the variable capacitor 443-2 being tuned to the target 42-2 and its parasitic paths.

The impedance combination chosen for each of the targets 42-1 and 42-2 is adjusted by the proper choice of the tap 336-1 and 336-2, respectively which adjusts the impedance at the lines 34-1 and 34-2.

It will be noted that each of the idler networks 28-1 and 28-2 is coupled through respective d.c. blocking capacitors 441-1 and 444-2 respectively to the cathodes 42-1 and 42-2 by way of the coupling lines 38-1 and 38-2 respectively. These blocking capacitors may have a capacitance, respectively of about two nanofarads and do not affect the operation of the circuits.

Looking in some detail at the load network circuits 32-1 and 32-2, herein lies an important aspect of the invention because it is one of the key features of the efficiency of the apparatus. The inductors 442-1 and 442-2 are tapped respectively at their center points 445-1 and 445-2, the feedpoints 441-1 and 441-2 being connected thereat. The inductor in each case acts to oppose the effect of the target capacitance by providing an inductive reactance to counter the capacitive reactance of the target. This can only be accomplished when the net effective capacitive reactance of the target combined with the target tuning capacitor exactly equals the net effective inductive reactance of the inductor.

Thus, for the load network 32-1, the inductive reactance of the coil 442-1 must equal the capacitive reactance of the target 42-1 and the tuning capacitor 443-1; while for the load network 32-2 the inductive reactance of the coil 442-2 must equal the capacitive reactance of the target 42-2 and the tuning capacitor 443-2.

One might consider that the entire inductor in each case could be more advantageously connected across the capacitance to the bucked out thereby eliminating the need for a tap, but the effect which occurs is that the coupling becomes poorer. This occurs, it is believed, because for the inductance required, the QL of the coil becomes too high, probably of the order of 20 or more. Under these circumstances, circulating r.f. currents and other factors will contribute to undue circuit losses with resulting ineffective coupling and power transfer. The tapped coil keeps the inductance high enough to provide the compensating inductive reactance while the presence of the entire coil in the network provides an L/C ratio which is appropriate to provide a lower QL with less circulating current.

In considering the circuitry of the apparatus 70, it will be appreciated that the low voltage, low impedance input at the tap 222 has been converted into a high voltage power signal at the line 38-1 and line 38-2 which will enable maximum power transfer to a load which has a low impedance shunting the desired moderate power absorbing impedance.

In a practical system through the utilization of the invention, the input voltage from the source 22 was about 400 volts a.c. which comprised 1,128 volts peak to peak while the voltage across a plurality of targets served by the circuit was 4,200 volts peak to peak for a source power of 3,200 watts. Each of the targets thus developed about 2,000 volts d.c. and each presented a load that had a parasitic capacitance on the order of 620 picofarads representing a shunting capacitive reactance which is about 15 ohms at the frequency of 13.56 mhz.

Figure 5:
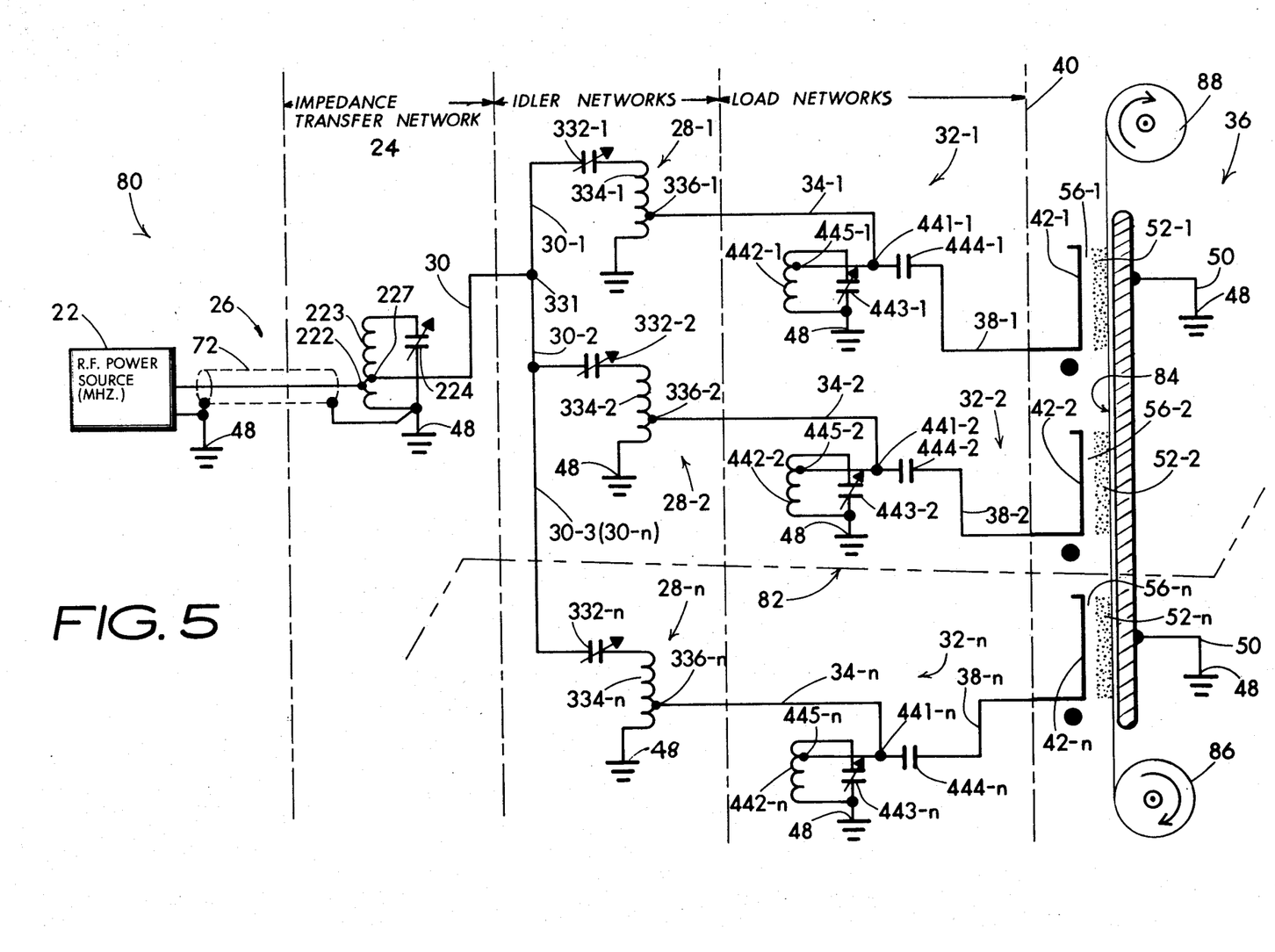
FIG. 5 is a diagram similar to that of FIG. 4 illustrating an embodiment of the invention that is applied to an apparatus in which there are at least three plasma fields but with a single anode and a substrate that passes sequentially through all of the plasma fields.

In FIG. 5, the apparatus 80 is illustrated in which there is a plurality of targets which are driven and there is a plurality of strings of resonant networks to provide the voltage and impedance transformation needed to transfer power efficiently to all of the targets. In this case there are three strings illustrated, the power source 22 and the impedance transfer network 24 being common to each string, two of the strings being intended to drive the targets 42-1 and 42-2 and the third string being illustrated to designate any one or more strings intended to drive a plurality of respective targets up to the number n, the target thus being designated 43-n.

Apparatus of this kind has been constructed and successfully operated with twelve targets being driven by twelve strings of tuned resonant networks whose overall configuration did not depart radically from that which is illustrated in FIG. 5. The dot dash line 82 is intended to signify that any number of strings may be included in the setup to serve that number of targets.

The reference numerals of FIG. 5 are so constituted that by consideration of the explanation of FIG. 4, it is possible to follow the construction and operation of the apparatus 80, there being practically no substantial differences between the circuits.

It will be noted that the tap 227 of FIG. 5 is located in a somewhat different position than the tap 227 of FIG. 4. In the case of FIG. 5, the tap 227 is located closer to ground 48 than in FIG. 4. The reason for this is that the reflected load impedance of each of the target configurations and its parasitic effects influences the impedance at the feed point 331. The impedance is somewhat lowered by the addition of each target. This adjustment is achieved by suitable experimentation which is well within the skill of the engineer who is operating the apparatus 80.

Another difference to be observed in this apparatus 80 is in the form of the sputtering device. The substrate which has been discussed is specifically shown at 84. It is presumed to be present in the other examples which have been described. Here the substrate is a web of metal, synthetic resin or the like flexible material which is interposed between the targets and the common anode 46. The plasma 52-1, 52-2 . . . 52-n in every case is directly at the substrate so that the deposit of the sputtered material is made onto the substrate 84 instead of onto the anode 46. In this device 36 there is a supply reel 86 of substrate and a takeup reel 88 for accumulating the coated substrate within the chamber defined by the container 40. Other structures may have these elements on the exterior so that the substrate enters and exits without the need for stopping the operation after a period of time that the supply is exhausted from the reel 86.

It might be pointed out that in the idler networks the capacitors 332-1, 332-2 . . . 332-n may be considered the "drive" capacitors and the inductors 336-1, 336-2 . . . 336-n may be considered the idler coils.

It often occurs that targets are located at different physical distances from their idler tuning networks which, at the frequencies of operation, produce different electrical conditions. The locations of the targets may produce different electrical phenomena because of their surrounding structure and the surrounding structure exterior of the sputtering chamber. Likewise, distributed inductance may delay signals in different amounts. In such case, the apparatus 90 of FIG. 6 is advantageous to compensate for the electrical differences resulting.

Figure 6:
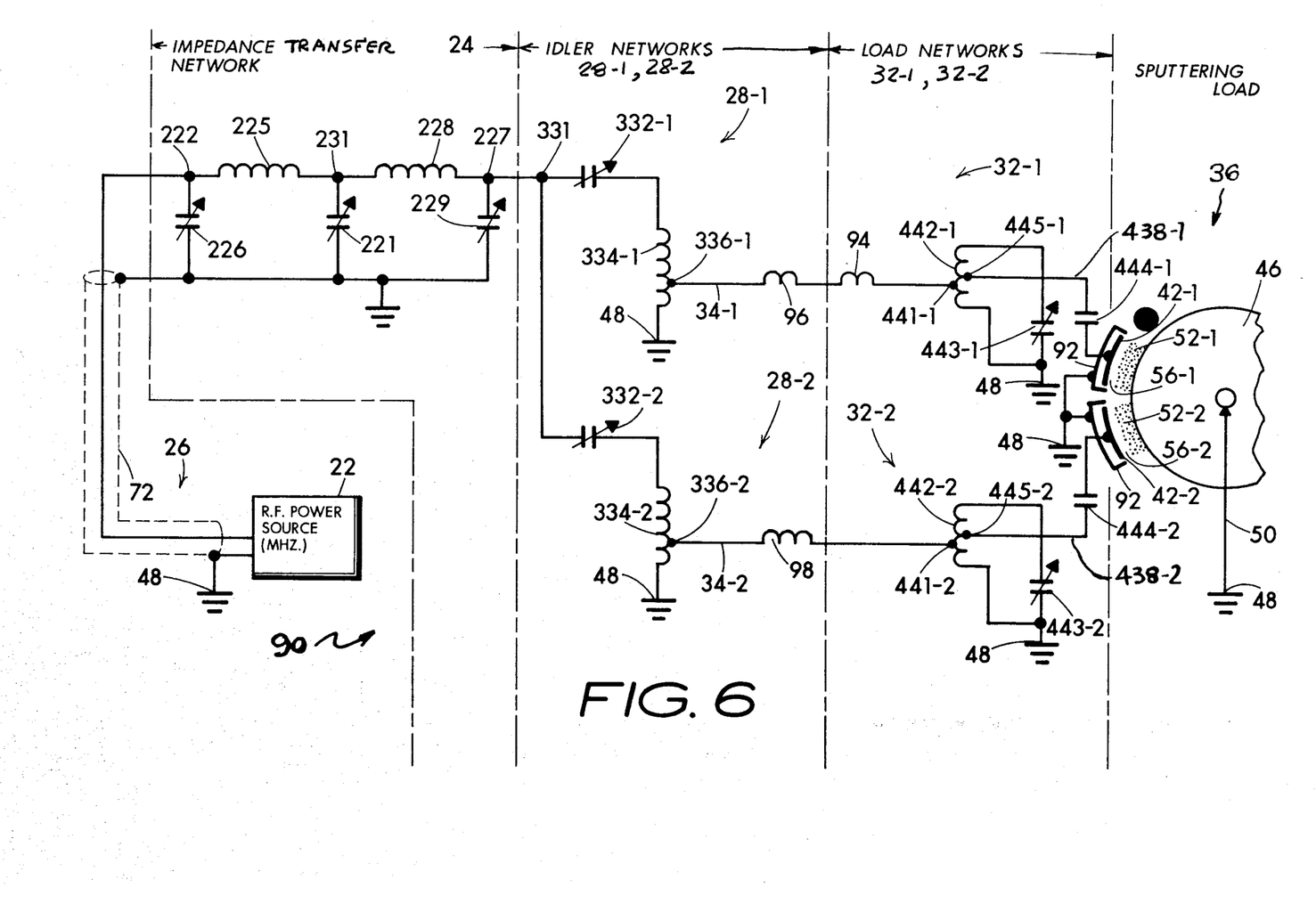
FIG. 6 is a circuit and block diagram of a modified form of the invention in which the electrical and/or physical distance of the targets from the idler tuning networks is not the same.

In FIG. 6 the solution to this problem is illustrated by the use of a slightly modified form of the invention. In apparatus 90 another form of electrode configuration is also illustrated. Here the anode 46 is in the form of a large rotary drum which is grounded by the lead 50. The targets 42-1 and 42-2 are here shown enclosed in shields 92 which are grounded. The exposed surfaces of the targets 42-1 and 42-2 face the anode 46 and are arcuate the configuration so that the plasma gap between the targets and the anode will be uniform. The resulting plasma is shown at 52-1 and 52-2. No substrate is shown and it may be assumed that there will be a web of substrate material passing over the drum during the sputtering process.

The problem which is involved here is that the electrical distance between the tap points 336-1 and 336-2 on the one hand and the input terminals of the load networks 32-1 and 32-2 respectively on the other hand are different. For purpose of illustration and understanding, it is assumed that the physical distance from the idler network 28-1 to its target 42-1 is less than the distance from the idler network 28-2 to its target 42-2. The electrical lengths of the lines 34-1 and 34-2 are thus required to be made equal for best and balanced operation. This is readily effected by the introduction of a small inductor in the shorter line 34-1 as indicated at 94 in such a manner that the lines are electrically equal. Assuming that the line 34-1 is the shorter, its theoretical lumped inductance 96 is shown to be less than the inductance 98. The balance of the lines will prevent any difference in signal delay in the lines so that all targets are energized equally and at the same time.

Also in FIG. 6 there is illustrated another form of the impedance transfer network 24 which has certain advantages in some applications. In this form of the invention, the impedance transfer network is made up of a pair of resonant Pi networks 230 and 231 connected in tandem. Due to the resonant condition, it is feasible through proper tuning of the variable capacitors 226, 221 and 229 in combination with the inductors 225 and 228 to achieve the conditions at the terminal 227 relative to the input at 222 which are identical to those existing in the other forms of the invention which have been described. The advantages of this configuration are that there is a reduction in spurious signals which may be radiated from the coaxial cable 72.

Another variation of the embodiment 90 over the other forms of the invention lies in the manner in which the target inductors 442-1 and 442-2 are tapped. In this case, although the output taps 445-1 and 445-2 are at the centers of the inductors 442-1 and 442-2 respectively, the input is inserted close to the bottom of each of the coils at 441-1 and 442-2. This has been found advantageous to achieve the desired tuning and balance when the target capacitance is very low, say of the order of 100 picofarads. Such a condition exists in practice when a sputtering apparatus which has been built and balanced to accommodate a certain size target has smaller targets substituted for the regular targets, either permanently or on a temporary basis.

In a practical electrode configuration similar to that of the sputtering device of FIG. 6, the targets were each of the order of 900 square centimeters in exposed area and this size together with the shield 92 surrounding the target gave a capacitance of about 550 picofarads. In such an apparatus, the load networks 32-1 and 32-2 are best located physically as close to the targets as possible, being mounted if at all feasible directly upon the wall 40 or mounting fittings which are exposed behind the targets on the exterior of the chamber.

Figure 7:
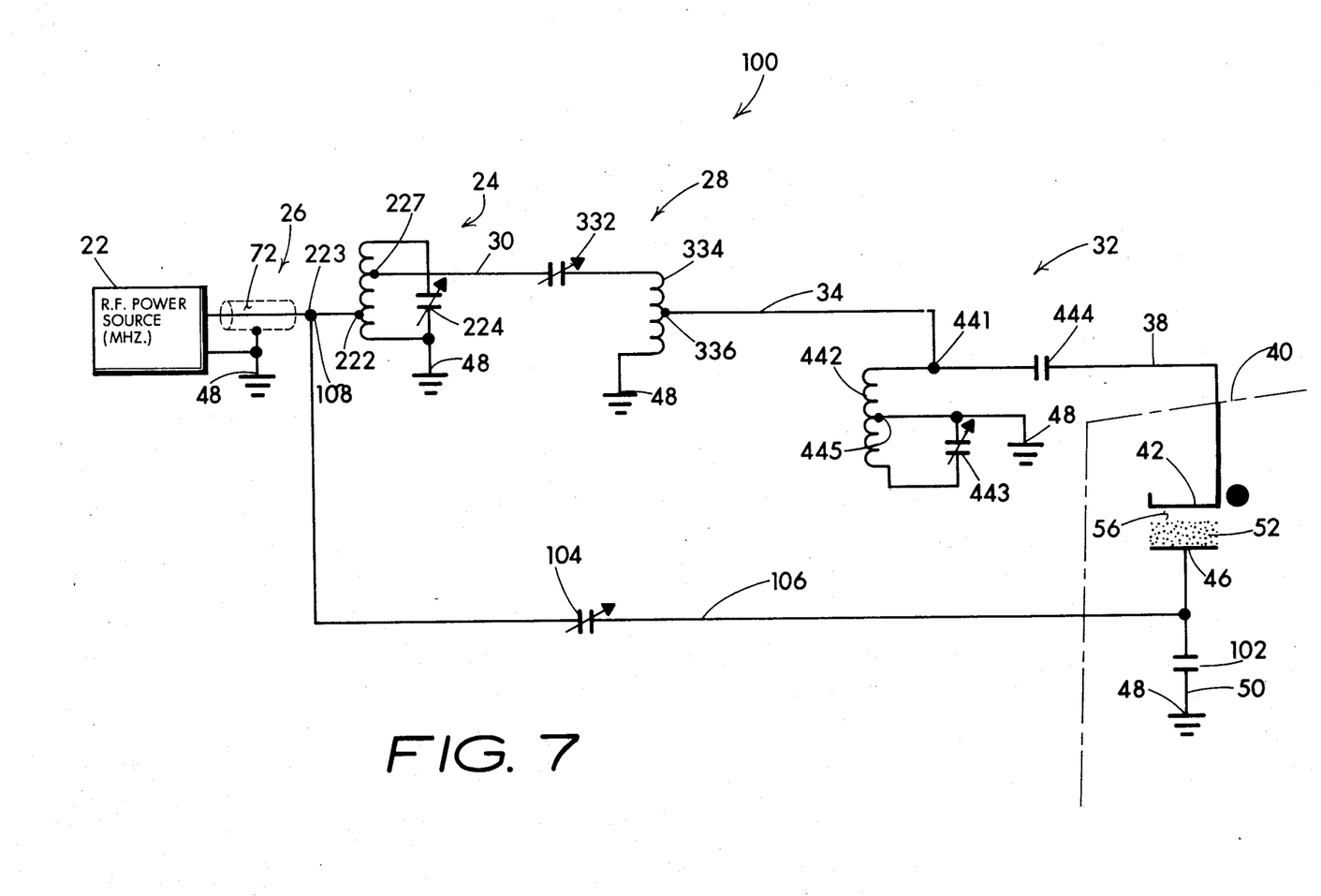
FIG. 7 is a circuit diagram of a modified form of the invention which is shown feeding a single plasma field, the circuit being similar to one portion of FIG. 4 but illustrating two variations, one being the manner in which a bias can be applied to the anode of the sputtering electrode configuration and the other being a circuit variation to accommodate a target with relatively high capacitance.

FIG. 7 is a diagrammatic view of a further embodiment of the invention for use in the event that the target capacitance is exceptionally high, such as for example on the order of 800 picofarads or more. Some improvement in coupling efficiency can be effected by increasing the effective impedance at the load network 32. Unlike the other forms of the invention, the line 34 connects to the inductor 442 at its uppermost or highest voltage terminal where the impedance will also be the highest. The inductor 442 is tapped at its center point 445 but this tap is connected to ground, the tuning capacitor 443 being connected across only the bottom half of the coil 442. Here the parasitic target capacitance and the tuning capacitor 443 being connected across only the bottom half of the coil 442. Thus the parasitic target capacitance and the tuning capacitor cooperate in a manner to enable a larger number of turns of the inductor 442 to be used, thereby increasing its inductance and improving the L/C ratio and generally improving operating impedance values. This partially unloads the effect of the stray capacitance from the target 42 on the coil 442 enabling the coil to have somewhat more inductance than would otherwise be practical. The QL is reduced along with the circulating currents to the benefit of the coil 442 and the idler coil 334 as well.

The apparatus 100 also includes structure for acquiring a so-called bias on the anode 46. In the practical system 100 there is a parasitic capacitance to ground associated with the anode 46, this capacitance being represented by the capacitor 102 in the line 50. Bias constitutes a low negative voltage existing on the anode 46 so that instead of being maintained at ground potential as is the case with the other forms of the apparatus described thus far it is maintained a few volts (10 to about 100) below ground. It should be understood that, since this is a diode configuration, if the cathode 42 is at a certain negative voltage below ground, then ground is the most positive potential relative to the cathode in the particular setup. If the anode is at a few volts below ground then ground is more positive than the anode.

By connecting a variable capacitor 104 in a line 106 that is tapped into the output of the source 22 at 108, this being the same voltage as at the point 222, one can adjust the division of voltage between the target 42 and the anode 46. This is determined by the ratio of capacitive reactance of the capacitors 102 and 104 acting as sections of a voltage divider. In this manner it is feasible to adjust bias from near zero to a value which is quite near the voltage at the point 222, although the latter value is not normally used during sputtering.

Those skilled in this art will recognize and be able to utilize the different forms of measuring instruments to achieve the desired conditions for most efficient operation as a result of the teaching herein. For example, a directional wattmeter may be installed between the source and the impedance transfer network for measurement of power; peak r.f. voltage measurements can be made by suitable means for indicating relative QL and for balancing the impedance transfer network and the other networks; target voltage measurements can be made by connecting a voltmeter across the target cathode to ground through an r.f. choke, multiplier and bypass condenser, etc.

Modifications are capable of being made to the apparatus without departing from the spirit or scope of the invention as defined in the appended claims.

What is claimed and desired to secure by Letters Patent of the United States is:

1. Apparatus for supplying power efficiently to the discharge plasma load in a sputtering chamber by means of r.f. energy of a predetermined frequency in the megahertz range which comprises:
A. a source of megahertz r.f. power having an impedance of the order of 50 ohms at its output terminals,
B. electrodes of the type adapted to function as cathode means and anode means during the sputtering process to produce sputtering plasma between them,
C. a pressure chamber including grounded metallic walls having said electrode means mounted therein and including grounded metallic structure surrounding and in relatively close proximity to a substantial portion of at least said cathode means for confining said plasma when generated, the input impedance of said electrode means including deleterious power transfer effects produced by the said surrounding structure and the metallic walls during sputtering operation of said apparatus, said effects being brought about principally by a first capacitive reactance parallel with said plasma having an impedance ohmage of the same order as that of said source impedance but which is a substantial number of times less than the impedance of the resistive component of said plasma, the electrodes being electrically coupled to said plasma during operation of said apparatus,
D. said apparatus including means to provide for transporting a substrate member relative to said anode means within said chamber between the anode means and the cathode means so that the plasma will sputter material derived from said cathode means upon said substrate member during operation of said apparatus and E. means for coupling said source to said electrodes to transfer power from said source to said plasma which comprises:

i. a string of three inductor and capacitor combination networks each being resonant at the frequency of said source and being connected seriatim between said source and electrodes, the first network following the source being an impedance transfer network effective to raise the voltage and impedance of the source, the second network following the impedance transfer network being an idler network, said idler network being effective substantially to raise the voltage of the impedance transfer network and a. having an output terminal at a certain voltage and impedance and b. a coupling line extending from said output terminal to said cathode means so that the output terminal voltage of said idler network is applied to said coupling line at the impedance of said output terminal of said idler network, the third network being a load network also connected to said coupling line and whose total capacitive reactance participating in the resonance condition of said load network includes the said first capacitive reactance parallel with said plasma, ii. at least the second and third network inductors being transformers, iii. each of the networks being constructed and arranged to have a ratio of Q/QL which is at least of the order of ten to provide efficient power transfer under load.

2. The apparatus as claimed in claim 1 in which the impedance transfer network raises the voltage of the output terminals of the source and increases the impedance thereof, the idler network substantially raises the voltage and impedance of the output terminals of the impedance transfer network and said output terminal of said idler network is at a voltage substantially below the maximum voltage of the idler network which lower voltage is required for the plasma and at an impedance which is a substantial match for the impedance of the plasma irrespective of the said parallel capacitive reactance, the third network having an inductive reactance which substantially balances said parallel capacitive reactance at resonance whereby said deleterious effects are substantially reduced if not eliminated.

3. The apparatus as claimed in claim 1 in which each of the transformers of said combination networks is an autotransformer.

4. The apparatus as claimed in claim 2 in which each of the transformers of said combination networks is an autotransformer.

5. The apparatus as claimed in claim 1 in which the inductor of said impedance transfer network is an autotransformer.

6. The apparatus as claimed in claim 2 in which the inductor of said impedance transfer network is an autotransformer.

7. The apparatus as claimed in claim 1 in which the impedance transfer network comprises at least one resonant Pi circuit having a series inductor and parallel variable capacitors to enable the tuning of said network.

8. The apparatus as claimed in claim 2 in which the impedance transfer network comprises at least one resonant Pi circuit having a series inductor and parallel variable capacitors to enable tuning of said network.

9. The apparatus as claimed in claim 1 in which there is a d.c. blocking capacitor in the coupling line.

10. The apparatus as claimed in claim 2 in which there is a d.c. blocking capacitor in the coupling line.

11. The apparatus as claimed in claim 9 in which the coupling line extends directly from the output terminal of said idler network to said d.c. blocking capacitor, the load network being connected to said output terminal of said idler network.

12. The apparatus as claimed in claim 10 in which the coupling line extends directly from the output terminal of said idler network to said d.c. blocking capacitor, the load network being connected to said output terminal of said idler network.

13. The apparatus as claimed in claim 9 in which the coupling line includes a portion of the inductor of said load network between the output terminal of the idler network and the d.c. blocking capacitor.

14. The apparatus as claimed in claim 10 in which the coupling line includes a portion of the inductor of said load network between the output terminal of the idler network and the d.c. blocking capacitor.

15. The apparatus as claimed in claim 1 in which the inductor of the load network is a coil of conductive tubing and has a tap which is common to the output terminal of the idler network.

16. The apparatus as claimed in claim 2 in which the inductor of the load network has a tap which is common to the output terminal of the idler network.

17. The apparatus as claimed in claim 15 in which the tap is substantially a center tap.

18. The apparatus as claimed in claim 16 in which the tap is substantially a center tap.

19. The apparatus as claimed in claim 1 in which said cathode means comprise a plurality of cathodes and there is a plurality of said strings of networks, each string being connected between said source and a respective different cathode, each string having said impedance transfer network in common whereby a single impedance transfer network serves all strings.

20. The apparatus as claimed in claim 2 in which said cathode means comprise a plurality of cathodes and there is a plurality of strings of networks, each string being connected between said source and a respective different cathode, each string having said impedance transfer network in common whereby a single impedance transfer network serves all strings.

21. The apparatus as claimed in claim 19 in which the anode means comprise a single anode, all of the cathodes being disposed in plasma forming relationship to the anode and each adapted to form a substantially independent plasma, the transportation providing means being arranged to move said substrate member such that any given area on said member will be sputtered by all of the plasmas in sequence while moving past the cathodes.

22. The apparatus as claimed in claim 20 in which the anode means comprise a single anode, all of the cathodes being disposed in plasma forming relationship to the anode and each adapted to form a substantially independent plasma, the transportation providing means being arranged to move said substrate member such that any given area on said member will be sputtered by all of the plasmas in sequence while moving past the cathodes.

23. The apparatus as claimed in claim 21 in which the anode comprises a rotary cylindrical drum, the transportation means being effective to maintain the substrate member in engagement with the drum over a substantial circumferential portion of the cylindrical surface of the drum, the cathodes are disposed within the area defined by the said substantial circumferential portion and the substrate member moves past the cathodes as the drum rotates.

24. The apparatus as claimed in claim 22 in which the anode comprises a rotary cylindrical drum, the transportation means being effective to maintain the substrate member in engagement with the drum over a substantial circumferential portion of the cylindrical surface of the drum, the cathodes are disposed within the area defined by the said substantial circumferential portion and the substrate member moves past the cathodes as the drum rotates.

25. The apparatus as claimed in claim 1 in which said cathode and anode means comprise a plurality of cathode-anode configurations and there is a plurality of said strings of networks connected to said source and to respective ones of said cathode-anode configurations.

26. The apparatus as claimed in claim 2 in which said cathode and anode means comprise a plurality of cathode-anode configurations and there is a plurality of said strings of networks connected to said source and to respective ones of said cathode-anode configurations.

27. The apparatus as claimed in claim 25 in which the electrical distance between the source and at least two of the configurations is different and there are means in the circuitry of said strings to compensate for this difference whereby all of the configurations will be energized at the same instantaneous point of time.

28. The apparatus as claimed in claim 26 in which the electrical distance between the source and at least two of the configurations is different and there are means in the circuitry of said strings to compensate for this difference whereby all of the configurations will be energized at the same instantaneous point of time.

29. The apparatus as claimed in claim 1 in which means are provided for maintaining the said anode means at a low effective negative potential which is substantially less than the effective negative potential of the cathode means whereby to provide a bias on said anode means during the operation of the apparatus.

30. The apparatus as claimed in claim 2 in which means are provided for maintaining the said anode means at a low effective negative potential which is substantially less than the effective negative potential of the cathode means whereby to provide a bias on said anode means during the operation of the apparatus.

31. The apparatus as claimed in claim 29 in which the means for maintaining the anode means at a low potential comprise a capacitive reactance voltage divider extended between the source and ground with the anode means being connected to a voltage point on said divider, the source being the maximum negative potential point of said divider.

32. The apparatus as claimed in claim 30 in which the means for maintaining the anode means at a low potential comprise a capacitive reactance voltage divider extended between the source and ground with the anode means being connected to a voltage point on said divider, the source being the maximum negative potential point of said divider.

33. The apparatus as claimed in claim 31 in which there is a variable capacitor between the voltage point of said divider and ground which provides a portion of the reactance along said divider whereby varying the capacitance of the variable capacitor will vary the potential at said voltage point.

34. The apparatus as claimed in claim 32 in which there is a variable capacitor between the voltage point of said divider and ground which provides a portion of the reactance along said divider whereby varying the capacitance of the variable capacitor will vary the potential at said voltage point.

35. A power transfer circuit for feeding power at high voltage and at megahertz radio frequency to a sputtering target of relatively large area in a sputtering chamber having surrounding structure which, with the target produces an extremely low capacitive reactance shunting path across the plasma when formed so that the power prefers to be applied to the shunting path rather than to the plasma, said circuit adapted to be connected to a source of r.f. power at megahertz frequency whose voltage is less than that required across said plasma and whose internal impedance is of the same order as the impedance of said shunting path but is many times less than the impedance of the plasma, said circuit comprising:

A. an impedance transfer network tuned to resonate at the said frequency having its input terminals adapted for connection to said source and being constructed to provide higher voltage and higher impedance across its output terminals than across its input terminals, B. an idler network tuned to resonate at said frequency and having its input terminals connected to the output terminals of said impedance transfer network, the idler network including a stepup transformer which raises the voltage and impedance from its input terminals to a value at least several times, the output terminals of said idler network including a tap on said transformer at which a voltage and impedance can be chosen which is substantially the same as the respective voltage and impedance required by the plasma, the idler network tap having means including a coupling line for extending a connection to said target so that the target may be energized at said last-mentioned voltage and impedance, and C. a load network tuned to a resonant condition at said frequency coupled to the coupling line, said network having an inductive reactance of a degree sufficient to cooperate with said shunting capacitive reactance to achieve said resonant condition whereby substantially if not completely to offset the power absorbing effect of said shunting capacitive reactance.

36. The circuit as claimed in claim 35 in which the idler network is a series resonant circuit including a capacitor and said stepup transformer and the said raised voltage and impedance occur in a connection between said capacitor and said stepup transformer, the said tap on said stepup transformer being located electrically a substantial voltage below said last-mentioned connection.

37. The circuit as claimed in claim 35 in which the impedance transfer network comprises an autotransformer having a single winding with a variable tuning capacitor shunting the winding, the input and output terminals including one of each which is ground potential, the other of the input and output terminals being connected to different taps on said single winding.

38. The circuit as claimed in claim 35 in which the load network comprises an autotransformer having a single winding with a variable capacitor shunting at least a first portion of said single winding and with the coupling line connected to a point on said winding which will add the capacitive reactance of said target to at least a second portion of said winding when said coupling line is extended to said target, said variable capacitor being capable of tuning said load network to resonant condition at said frequency.

39. The circuit as claimed in claim 35 in which there is a d.c. blocking capacitor in said coupling line.

40. The circuit as claimed in claim 36 in which there is a d.c. blocking capacitor in said coupling line.

41. The circuit as claimed in claim 38 in which the first portion of the said last-mentioned single winding comprises substantially all of the winding and the second portion of said winding comprises less than all of said winding.

42. The circuit as claimed in claim 41 in which the second portion comprises substantially half of the said single winding.

43. The circuit as claimed in claim 41 in which the second portion comprises substantially more than half of the said single winding.

44. The circuit as claimed in claim 42 in which said coupling line includes a third portion of the said last-mentioned single winding in series therewith.

45. The circuit as claimed in claim 38 in which said first portion of said single winding comprises less than all of the said single winding.

46. The circuit as claimed in claim 38 in which the said second portion of said single winding comprises substantially all of said single winding.

47. The circuit as claimed in claim 46 in which the said first portion of said single winding comprises substantially less than all of said single winding and the said second portion comprises substantially all of said single winding.

48. The circuit as claimed in claim 35 in which the networks in each case are formed of inductors wound from large diameter thin-walled metal tubing and the capacitors are low loss capacitors, the Q/QL of each network being greater than ten.

49. The circuit as claimed in claim 35 in which the impedance transfer network comprises Pi sections including series inductors and parallel variable capacitors for tuning the said impedance transfer network.

50. The circuit as claimed in claim 35 which is adapted for feeding power to a plurality of such targets and in which there is a single impedance transfer network as aforesaid, a plurality of said idler networks equal in number to the number of targets which are adapted to be fed, all idler networks having their input terminals connected to the output terminals of said single impedance transfer network, each idler network having a separate said coupling line, and in which there is a plurality of said load networks each being coupled to a respective one of said coupling lines.

* * * * *